United States Patent
Yu et al.

(10) Patent No.: US 10,020,818 B1
(45) Date of Patent: Jul. 10, 2018

(54) SYSTEMS AND METHODS FOR FAST DELTA SIGMA MODULATION USING PARALLEL PATH FEEDBACK LOOPS

(71) Applicant: MY Tech, LLC, Irvine, CA (US)

(72) Inventors: Tommy Yu, Orange, CA (US); Avanindra Madisetti, Coto de Caza, CA (US)

(73) Assignee: MY Tech, LLC, Irvine, CA (US)

( * ) Notice: Subject to any disclaimer, the term of this patent is extended or adjusted under 35 U.S.C. 154(b) by 0 days.

(21) Appl. No.: 15/470,805

(22) Filed: Mar. 27, 2017

Related U.S. Application Data

(60) Provisional application No. 62/313,514, filed on Mar. 25, 2016.

(51) Int. Cl.
| | |
|---|---|
| *H03M 3/00* | (2006.01) |
| *H03M 1/06* | (2006.01) |
| *H03M 3/02* | (2006.01) |
| *H04L 1/00* | (2006.01) |
| *H04B 1/40* | (2015.01) |
| *H03M 1/12* | (2006.01) |

(52) U.S. Cl.
CPC ......... *H03M 3/458* (2013.01); *H03M 1/0656* (2013.01); *H03M 3/412* (2013.01); *H03M 3/434* (2013.01); *H03M 3/452* (2013.01); *H03M 3/454* (2013.01); *H03M 3/46* (2013.01); *H03M 3/464* (2013.01); *H03M 1/12* (2013.01); *H03M 3/022* (2013.01); *H03M 3/30* (2013.01); *H03M 3/436* (2013.01); *H04B 1/40* (2013.01); *H04L 1/006* (2013.01)

(58) Field of Classification Search
CPC .......... H03M 3/30; H03M 1/12; H03M 3/022; H04B 1/40; H04L 1/006
USPC .................. 341/143, 155; 375/219, 252, 265
See application file for complete search history.

(56) References Cited

U.S. PATENT DOCUMENTS

| | | | |
|---|---|---|---|
| 5,682,161 A | * | 10/1997 | Ribner ................. H03M 3/412 341/143 |
| 6,724,249 B1 | | 4/2004 | Nilsson |
| 7,176,820 B1 | | 2/2007 | Fuller et al. |
| 8,949,699 B1 | | 2/2015 | Gustlin |
| 2001/0022555 A1 | | 9/2001 | Lee et al. |
| 2002/0053986 A1 | | 5/2002 | Brooks et al. |
| 2002/0057214 A1 | | 5/2002 | Brooks et al. |
| 2002/0061086 A1 | | 5/2002 | Adachi et al. |

(Continued)

FOREIGN PATENT DOCUMENTS

WO    2016063038 A1    4/2016

OTHER PUBLICATIONS

Aigner et al., "Advancement of MEMS into RF-Filter Applications", International Electron Devices Meetings, IEDM '02, Dec. 8-11, 2002, pp. 897-900.

(Continued)

*Primary Examiner* — Joseph Lauture
(74) *Attorney, Agent, or Firm* — KPPB LLP

(57) ABSTRACT

An error feedback system for a delta sigma modulator is disclosed. The error feedback system has an error transfer function where at least k−1 coefficients are set to zero. This allows the error feedback system to be divided into k feedback paths that are performed in parallel at a clock speed that is 1/k of the system clock of the delta sigma modulator (i.e. the rate at which the output of the delta sigma modulator changes).

20 Claims, 7 Drawing Sheets

(56) References Cited

U.S. PATENT DOCUMENTS

| | | |
|---|---|---|
| 2002/0093442 A1 | 7/2002 | Gupta et al. |
| 2003/0128143 A1 | 7/2003 | Yap et al. |
| 2003/0137359 A1 | 7/2003 | Patana et al. |
| 2003/0174080 A1 | 9/2003 | Brooks et al. |
| 2003/0179121 A1 | 9/2003 | Gupta et al. |
| 2003/0227401 A1 | 12/2003 | Yang et al. |
| 2004/0032355 A1 | 2/2004 | Melanson et al. |
| 2004/0066321 A1 | 4/2004 | Brooks et al. |
| 2004/0081266 A1 | 4/2004 | Adachi et al. |
| 2004/0108947 A1 | 6/2004 | Yang et al. |
| 2004/0228416 A1 | 11/2004 | Anderson et al. |
| 2004/0233084 A1 | 11/2004 | Brooks et al. |
| 2004/0233085 A1 | 11/2004 | Fukuda et al. |
| 2004/0252038 A1 | 12/2004 | Robinson et al. |
| 2005/0001750 A1 | 1/2005 | Lo et al. |
| 2005/0012649 A1 | 1/2005 | Adams et al. |
| 2005/0030212 A1 | 2/2005 | Brooks et al. |
| 2005/0057385 A1 | 3/2005 | Gupta et al. |
| 2005/0062627 A1 | 3/2005 | Jelonnek et al. |
| 2005/0063505 A1 | 3/2005 | Dubash et al. |
| 2005/0088327 A1 | 4/2005 | Yokoyama et al. |
| 2005/0093726 A1 | 5/2005 | Hezar et al. |
| 2005/0116850 A1 | 6/2005 | Hezar et al. |
| 2005/0128111 A1 | 6/2005 | Brooks et al. |
| 2005/0156767 A1 | 7/2005 | Melanson et al. |
| 2005/0156768 A1 | 7/2005 | Melanson et al. |
| 2005/0156771 A1 | 7/2005 | Melanson et al. |
| 2005/0162222 A1 | 7/2005 | Hezar et al. |
| 2005/0207480 A1 | 9/2005 | Norsworthy et al. |
| 2005/0266805 A1 | 12/2005 | Jensen et al. |
| 2005/0285685 A1 | 12/2005 | Frey et al. |
| 2006/0028364 A1 | 2/2006 | Rivoir et al. |
| 2006/0038708 A1 | 2/2006 | Luh et al. |
| 2006/0044057 A1 | 3/2006 | Hezar et al. |
| 2006/0109153 A1 | 5/2006 | Gupta et al. |
| 2006/0115036 A1 | 6/2006 | Adachi et al. |
| 2006/0164276 A1 | 7/2006 | Luh et al. |
| 2006/0290549 A1 | 12/2006 | Laroia et al. |
| 2007/0001776 A1 | 1/2007 | Li et al. |
| 2007/0013566 A1 | 1/2007 | Chuang et al. |
| 2007/0018866 A1 | 1/2007 | Melanson et al. |
| 2007/0035425 A1 | 2/2007 | Hinrichs et al. |
| 2007/0080843 A1 | 4/2007 | Lee et al. |
| 2007/0126618 A1 | 6/2007 | Tanaka et al. |
| 2007/0152865 A1 | 7/2007 | Melanson et al. |
| 2007/0165708 A1 | 7/2007 | Darabi et al. |
| 2007/0279034 A1 | 12/2007 | Roh et al. |
| 2008/0062022 A1 | 3/2008 | Melanson et al. |
| 2008/0062024 A1 | 3/2008 | Maeda et al. |
| 2008/0100486 A1 | 5/2008 | Lin et al. |
| 2008/0180166 A1 | 7/2008 | Gustat et al. |
| 2008/0191713 A1 | 8/2008 | Hauer et al. |
| 2008/0198050 A1 | 8/2008 | Akizuki et al. |
| 2008/0211588 A1 | 9/2008 | Frey et al. |
| 2008/0272945 A1 | 11/2008 | Melanson et al. |
| 2008/0272946 A1 | 11/2008 | Melanson et al. |
| 2009/0083567 A1 | 3/2009 | Kim et al. |
| 2009/0096649 A1 | 4/2009 | Ferri et al. |
| 2009/0220219 A1 | 9/2009 | McLeod et al. |
| 2009/0309774 A1 | 12/2009 | Hamashita et al. |
| 2010/0045498 A1 | 2/2010 | Liu et al. |
| 2010/0052960 A1 | 3/2010 | Lakdawala et al. |
| 2010/0074368 A1 | 3/2010 | Karthaus et al. |
| 2010/0164773 A1 | 7/2010 | Clement et al. |
| 2010/0214143 A1 | 8/2010 | Nakamoto et al. |
| 2010/0219999 A1 | 9/2010 | Oliaei et al. |
| 2010/0225517 A1 | 9/2010 | Aiba et al. |
| 2010/0283648 A1 | 11/2010 | Niwa et al. |
| 2010/0295715 A1 | 11/2010 | Sornin et al. |
| 2011/0006936 A1 | 1/2011 | Lin et al. |
| 2011/0050472 A1 | 3/2011 | Melanson et al. |
| 2011/0149155 A1 | 6/2011 | Lin et al. |
| 2011/0299642 A1 | 12/2011 | Norsworthy et al. |
| 2012/0063519 A1 | 3/2012 | Oliaei et al. |
| 2012/0194369 A1 | 8/2012 | Galton et al. |
| 2012/0200437 A1 | 8/2012 | Moue et al. |
| 2012/0242521 A1 | 9/2012 | Kinyua et al. |
| 2012/0275493 A1 | 11/2012 | Fortier et al. |
| 2012/0280843 A1 | 11/2012 | Tsai et al. |
| 2012/0286982 A1 | 11/2012 | Kajita et al. |
| 2013/0068019 A1 | 3/2013 | Takase et al. |
| 2013/0099949 A1 | 4/2013 | Wagner et al. |
| 2013/0169460 A1 | 7/2013 | Obata et al. |
| 2013/0259103 A1 | 10/2013 | Jensen et al. |
| 2014/0028374 A1 | 1/2014 | Zare-Hoseini et al. |
| 2014/0035769 A1 | 2/2014 | Rajaee Omid et al. |
| 2014/0070969 A1 | 3/2014 | Shu |
| 2014/0113575 A1 | 4/2014 | Mitani et al. |
| 2014/0286467 A1 | 9/2014 | Norsworthy et al. |
| 2014/0307825 A1 | 10/2014 | Ostrovskyy et al. |
| 2014/0320325 A1 | 10/2014 | Muthers et al. |
| 2014/0368365 A1 | 12/2014 | Quiquempoix et al. |
| 2015/0002325 A1 | 1/2015 | Lin |
| 2015/0009054 A1 | 1/2015 | Ono et al. |
| 2015/0036766 A1 | 2/2015 | Elsayed et al. |
| 2015/0061907 A1 | 3/2015 | Miglani |
| 2015/0084797 A1 | 3/2015 | Singh et al. |
| 2015/0109157 A1 | 4/2015 | Caldwell et al. |
| 2015/0116138 A1 | 4/2015 | Li et al. |
| 2015/0146773 A1 | 5/2015 | Ma et al. |
| 2015/0171887 A1 | 6/2015 | Okuda |
| 2015/0341159 A1 | 11/2015 | Norsworthy et al. |
| 2015/0349794 A1 | 12/2015 | Lin |
| 2016/0013805 A1 | 1/2016 | Maehata |
| 2016/0049947 A1 | 2/2016 | Adachi |
| 2016/0050382 A1 | 2/2016 | Rizk et al. |
| 2016/0065236 A1 | 3/2016 | Ahmed et al. |
| 2016/0149586 A1 | 5/2016 | Roh et al. |
| 2016/0336946 A1 | 11/2016 | Ho et al. |
| 2016/0344404 A1 | 11/2016 | Miglani et al. |
| 2016/0359499 A1 | 12/2016 | Bandyopadhyay |
| 2016/0373125 A1 | 12/2016 | Pagnanelli et al. |
| 2017/0033801 A1 | 2/2017 | Lo et al. |
| 2017/0041019 A1 | 2/2017 | Miglani et al. |
| 2017/0045403 A1 | 2/2017 | Zanbaghi et al. |
| 2017/0093407 A1 | 3/2017 | Kim et al. |
| 2017/0102248 A1 | 4/2017 | Maurer et al. |
| 2017/0134055 A1 | 5/2017 | Ebrahimi et al. |
| 2017/0163295 A1 | 6/2017 | Talty et al. |
| 2017/0170839 A1 | 6/2017 | Zhao et al. |
| 2017/0170840 A1 | 6/2017 | Zhao |
| 2017/0184645 A1 | 6/2017 | Sawataishi |
| 2017/0222652 A1 | 8/2017 | Adachi |
| 2017/0222658 A1 | 8/2017 | Miglani et al. |
| 2017/0250662 A1 | 8/2017 | Cope et al. |
| 2017/0276484 A1 | 9/2017 | Marx et al. |
| 2017/0288693 A1 | 10/2017 | Kumar et al. |

OTHER PUBLICATIONS

Lam, "A Review of the Recent Development of MEMS and Crystal Oscillators and Their Impacts on the Frequency Control Products Industry", Invited Paper, 2008 IEEE International Ultrasonics Symposium, Beijing, Nov. 2-5, 2008, 11 pages.

Piazza et al., "Piezoelectric Aluminum Nitride Vibrating Contour-Mode MEMS Resonators", Journal of Microelectromechanical Systems, Dec. 2006, vol. 15, No. 6, pp. 1406-1418.

International Search Report and Written Opinion for International Application No. PCT/US2017/062744, Search completed Jan. 17, 2018, dated Feb. 5, 2018, 13 Pgs.

\* cited by examiner

SYSTEMS AND METHODS FOR FAST DELTA SIGMA MODULATION USING PARALLEL PATH FEEDBACK LOOPS

CROSS REFERENCED APPLICATIONS

This application claims priority under 35 U.S.C. 119(e) to U.S. Provisional Patent Application Ser. No. 62/313,514, entitled "Systems and Methods for Fast Delta Sigma Modulation Using Parallel Path Feedback Loops", filed Mar. 25, 2016 that is hereby incorporated by reference in its entirety as if set forth herewith.

FIELD OF THE INVENTION

The present invention relates to delta sigma modulators and more specifically to increasing modulator speed through parallelization of the feedback path.

BACKGROUND

Delta sigma modulation is a method for encoding analog signals into digital signals as found in an analog to digital (ADC) converter. Delta sigma modulation may also be used to transfer high bit-count low frequency digital signals into lower bit-count higher frequency digital signals as found in digital to analog (DAC) operation. This technique is popular in modern electronic components such as converters, frequency synthesizers, switched-mode power supplies and motor controllers, due to its cost efficiency and reduced circuit complexity.

In addition, delta sigma modulators may reduce noise using noise shaping and increase signal resolution using filtering. In noise shaping, noise is filtered by a noise shaping filter. This means that the noise is reduced inside frequencies of interest and increased outside the frequencies of interest. As a result, the resolution of the signal is increased. In delta sigma modulators, noise shape filtering may be performed at an over-sampled rate. The noise shaping is achieved by sampling subtracting estimated in-band noise from an input signal of the delta sigma modulator. The estimated in-band noise subtraction is done through the feed-back path in the modulator. A post noise shaping filter is placed after the modulator that cuts the noise from outside the frequency of interest which, in turn increases the signal's resolution.

As such, delta sigma modulators provide a less complex and cost efficient manner to perform Analog to Digital (A/D) and Digital to Analog (D/A) conversion in many electronic components including, but not limited to ADCs, DACs, frequency synthesizers, switch-mode power supplies, and motor controllers.

SUMMARY OF THE INVENTION

An advance in the art is made by systems and methods for fast delta sigma modulation using parallel feedback paths in accordance with embodiments of the invention. In accordance with some embodiments of this invention, a delta sigma modulator is configured in a following manner. A delta sigma modulator has a system clock input configured to receive a system clock signal and a delta sigma modulator input configured to receive an input signal. A delta sigma modulator output is configured to provide a delta sigma modulated output to a truncator. The truncator is configured to generate the delta sigma modulated output based upon a sum of the input signal and an error feedback signal provided by an error feedback system that generates the error feedback signal. The error feedback system comprises k feedback paths that execute in parallel. Each of the k paths are clocked to 1/k clock cycles of the system clock signal and k is an integer equal to or greater than two.

In accordance with some embodiments, the error feedback system receives as an input a difference between the sum of the input signal and an error feedback signal; and the delta sigma modulated output. In accordance with many of embodiments, the delta sigma modulator is an N order delta sigma modulator where N is an integer equal to or greater than two. In accordance with a number of these embodiments, each of the k feedback paths include N/k registers that are clocked at a rate 1/k of the system clock signal. In accordance with several embodiments, each of the k feedback path generates a signal that is a weighted sum of values stored in the N/k registers, where the generated signal is combined with the input to the error feedback system. In accordance with still some other of these embodiments, each of the k feedback path generates a signal that is a weighted sum of values stored in the N/k registers and the generated signal is quantized by a quantizer to produce an error feedback signal. In accordance with many of these embodiments, k is less than N.

In accordance with some embodiments, the truncator is a quantizer. In accordance with many embodiments, each of the k feedback paths are out of phase with each other. In accordance with a number of these embodiments, each feedback path generates a separate output and the delta sigma modulator output is selected from the output of a different feedback path every clock cycle of the system clock signal.

DETAILED DISCLOSURE OF THE INVENTION

Turning now to the drawings, systems and methods for implementing fast delta sigma modulation using parallel feedback paths in accordance with some embodiments of the invention are described. In accordance with certain embodiments of the invention, a delta sigma modulation system includes two or more feedback paths. Each feedback path can include one or more filters in accordance with many embodiments. In accordance with many embodiments, one or more coefficients in a filter within a feedback path is set to zero. The setting of the coefficients to zero allows the calculations of the filter to be performed in parallel. In this way, the feedback signal can be generated using previous sample associated with non-zero filter coefficient. The provision of feedback paths that may be completed in parallel in accordance with many embodiments of the invention, offers several advantages over the traditional design of a delta sigma modulator. A first advantage is that the parallel computation of the feedback paths can achieve faster effective speeds than traditional designs. A second advantage is that the delta sigma modulator may no longer be limited by the device delay of any individual feedback path, which can be clocked at lower rates than the delta sigma modulator. In accordance with a number of embodiments, a third advantage is that there is no overhead for the parallelization of the feedback paths. Thus, the number of computations needed to provide the parallel feedback paths may be the same as the number of calculations needed for serial computation of multiple feedback paths with no overhead for parallelization. A fourth advantage of delta sigma modulation performed using parallel feedback paths is that very high modulation speeds or rates may be achieved with applications in areas including, but not limited to, direct-RF conversion and switched-mode power amplifiers.

A description of systems and methods for performing delta sigma modulation using parallel feedbacks paths follows.

Analog to Digital Conversion Using Delta Sigma Modulation

Figure 1:
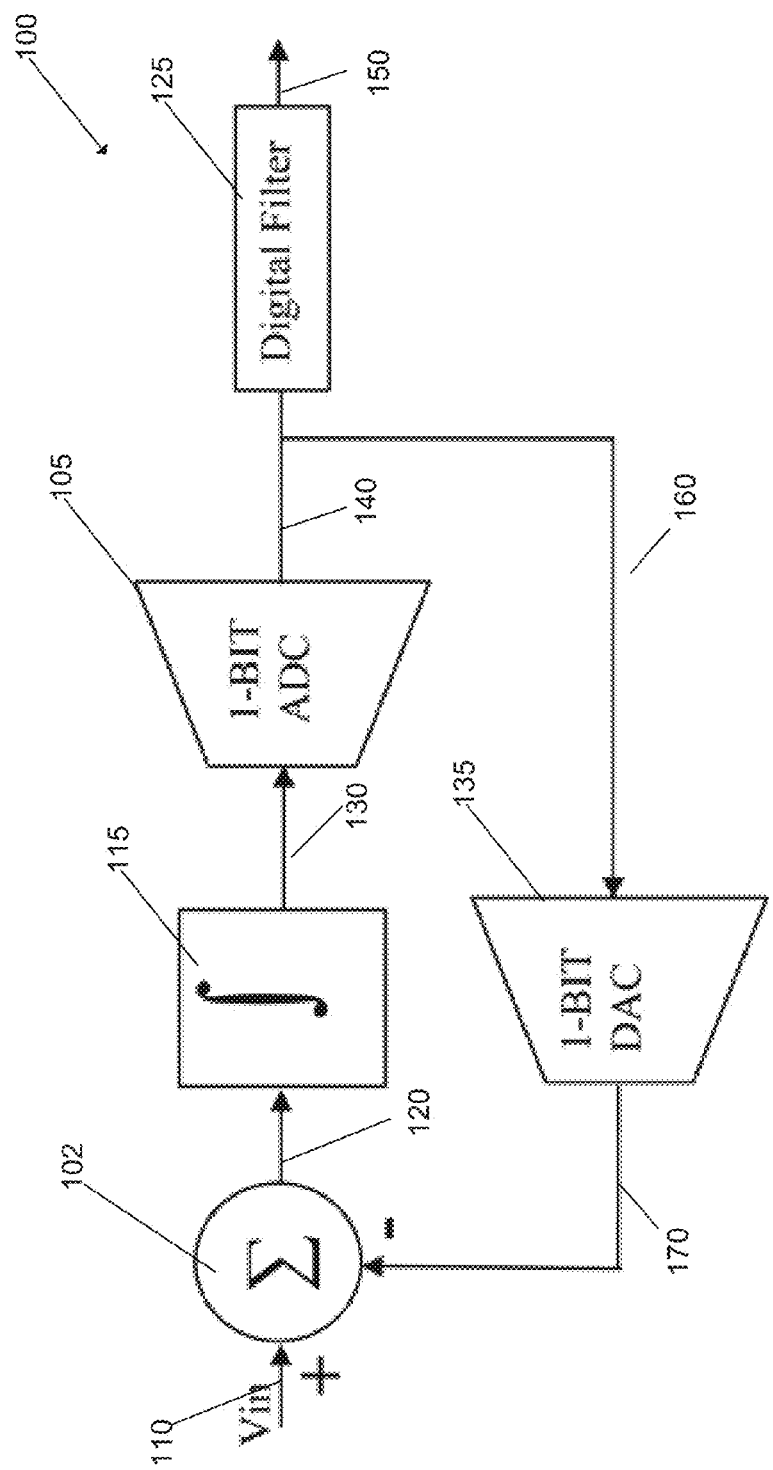
FIG. 1 illustrates an example of delta sigma modulation used in an ADC application.

Delta sigma modulation may be used to convert analog signals into digital signals. An example of delta sigma modulation system used in an ADC is illustrated in FIG. 1. One skilled in the art will appreciate that the delta sigma modulation ADC system 100 may be embodied in hardware components, software components, or any combination thereof. Furthermore, one skilled in the art will appreciate that delta sigma modulation system 100 is only a representation of a system that performs delta sigma modulation and the exact components and/or processes performed may be different in various other systems implementing delta sigma modulation.

In FIG. 1, the delta sigma modulation system receives an input signal along path 110 and uses an adder component 102 to combine the input signal with an error signal 170 generated by a feedback loop described below. In accordance with many embodiments, the error signal is subtracted from the input signal to remove noise from the input signal. An integrator component 115 then receives the corrected input signal and sums the corrected input signal over a sample interval. The integrated signal 130 is then provided to ADC system 105 that compares the output 130 of integrator 115 with a reference signal to determine a digital signal 140. The digital signal 140 is provided to a 1-bit DAC system 135 that converts digital signal 140 to an analog error signal 170. Digital filter 125 receives the digital signal 140, removes quantization noise from the digital signal and provides an output digital signal 150.

In FIG. 1, noise shaping can be performed by oversampling in an integrator 115 having a high pass characteristic, where the low frequency quantization noise is attenuated. The noise shaping for a particular delta sigma modulator can depend on the oversampling ratio of the low-resolution ADC clock, the input signal band of interest, and the order of the particular delta sigma modulator. The digital filter 125 can be used to remove any out of band quantization noise generated by integrator 115 and/or ADC system 105. In accordance with some embodiments, a very high resolution ADC (e.g., 12 bits or more) can be achieved using a single bit ADC running at high speed.

Digital to Analog Conversion Using Delta Sigma Modulation

Figure 2:
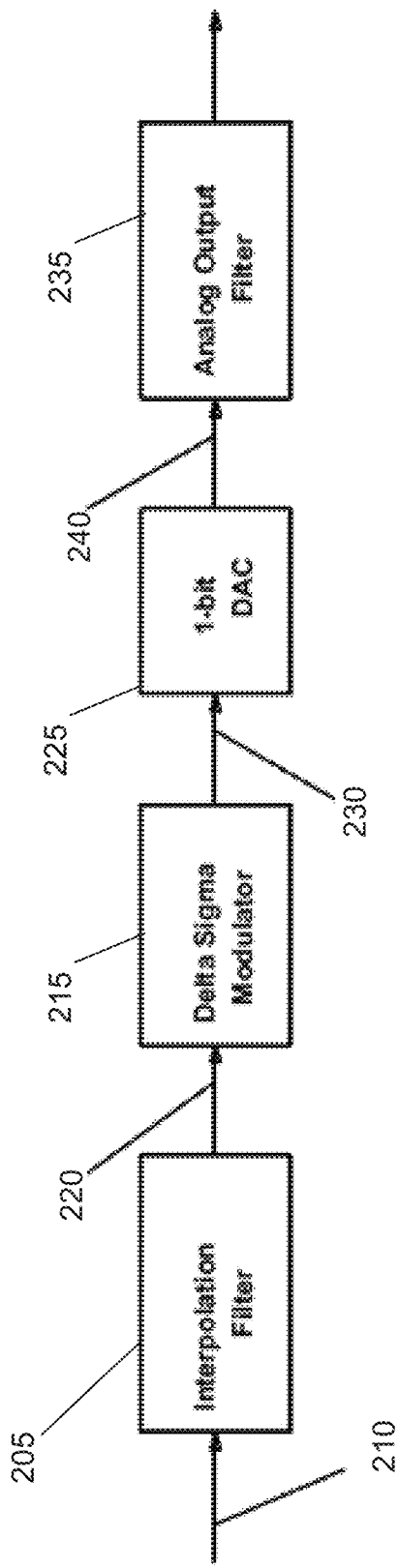
FIG. 2 illustrates an example of delta sigma modulation in a DAC.

Delta sigma modulation may also be used in a DAC application. An example of the components and/or processes of delta sigma modulation in a DAC operation are illustrated in FIG. 2. One skilled in the art will appreciate that the delta sigma modulation DAC system 200 may be embodied in hardware components, software components, or any combination thereof. Furthermore, one skilled in the art will appreciate that the delta sigma modulation DAC system 200 is only a representation of a system that performs delta sigma modulation and the exact components and/or steps performed may be different in various other systems implementing delta sigma modulation.

In FIG. 2, a low frequency high-resolution (16 bits) signal may be converted from the signal encoded with a digital word into an analog signal. Instead of using a high resolution DAC for conversion, the DAC conversion is performed by a high speed, low resolution DAC 225. In system 200, the input digital signal 210 is received by interpolation filter 205 and up-sampled to high-speed signal 220. The high-speed signal 220 is modulated using a delta sigma modulator 215. The modulated signal 230 is then converted to an analog signal 240 with a one-bit DAC 22. An analog output filter 235 may then be used to remove the high frequency quantized noise due to the delta sigma modulation from the analog signal 240 to provide the output analog signal. The output analog signal may have the same quality as a signal generated using a high resolution DAC in a low frequency band of interest. However, the system 200 using a delta sigma modulator may be much cheaper than systems with a high precision DAC. Typically, the feedback structure is used for delta sigma operation in DAC conversion since there is no mismatch in the digital implementation.

Error Feedback Loop in a Delta Sigma Modulator

Figure 3:
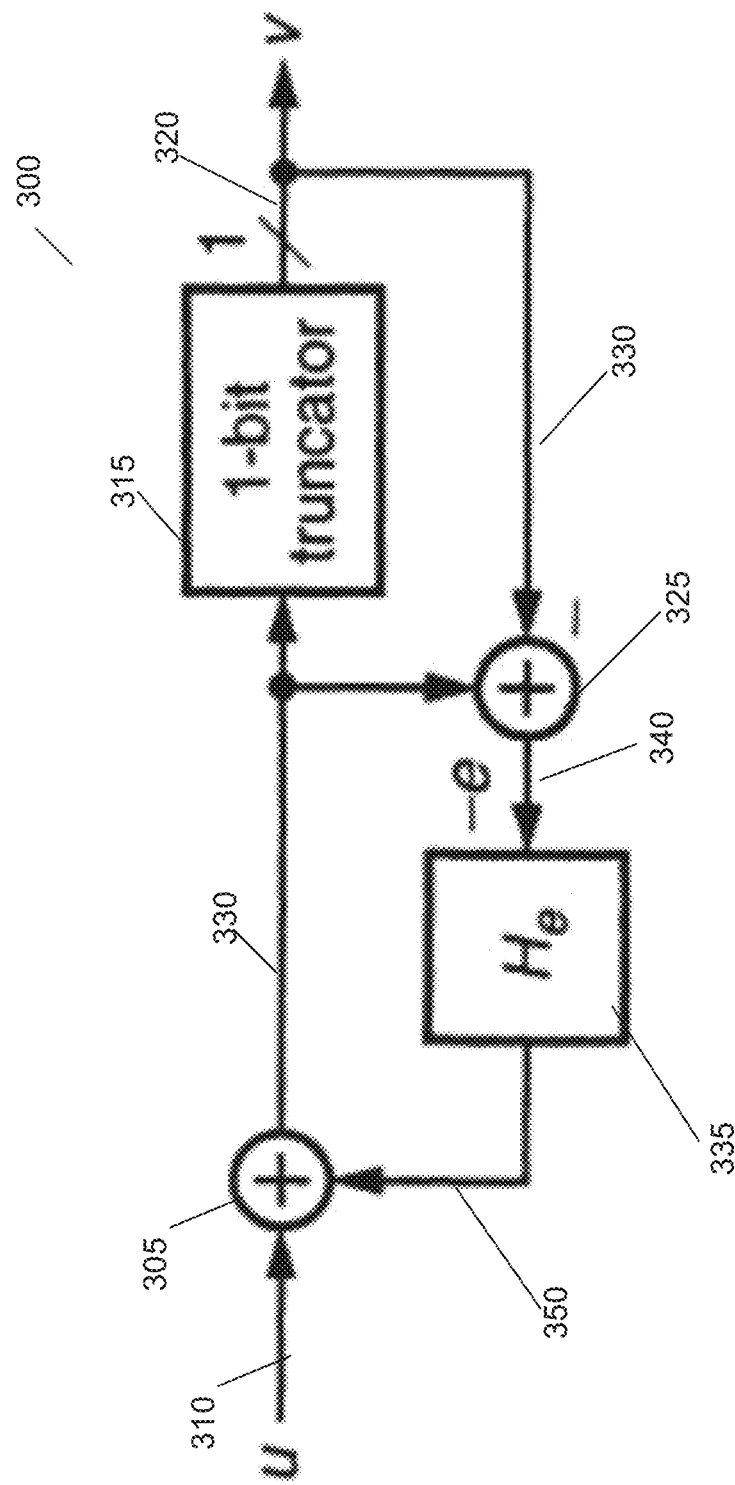
FIG. 3 illustrates an example of a block diagram of an error feedback design with a 1-bit quantizer.

There are many different delta sigma modulator implementations that have different architectures. The exact architecture of a delta sigma implementation depends on factors including, but not limited to, the oversampling ratio of the low-resolution ADC clock, the input signal band of interest, and the order of the delta sigma modulator implementation. However, delta sigma implementations typically include an error feedback structure. An example of a block diagram components and/or processes of an error feedback design of a delta sigma modulator with a 1-bit quantizer in accordance with an embodiment of the invention is illustrated in FIG. 3. One skilled in the art will recognize that only the components of a delta sigma modulator 300 necessary for understanding the error feedback path are shown in FIG. 3. Furthermore, the components and/or processes illustrated in FIG. 3 may be implemented by hardware components, software components, or any combination thereof.

As illustrated in FIG. 3, delta sigma modulator 300 includes an adder component 305 that receives a delta sigma modulator input signal 310 and a filtered error signal 350. The input signal 310 and the filtered error signal 350 are combined by the adder component 305 to output a corrected input signal 330. The corrected input signal is received by a 1-bit truncator component 315 and an adder component 325. The 1-bit truncator component 315 generates the delta sigma modulator output signal 320 that is provided as an output and is received by adder component 325. The adder component 325 combines the corrected input signal and the output signal to generate an error signal 340. $H_e$ 335 is an error feedback transfer function. The quantizer error may be calculated and filtered by the error feedback transfer function $H_e$ 335 from the error signal to generate the filtered error signal. The filtered error signal is provided to adder component 305 to be summed with the delta sigma modulator input signal 310 for quantization.

Despite the many advantages that a delta sigma modulator can offer, conventional delta sigma modulators are considered to experience speed limitation due to the feedback loop. The quantized error in a conventional delta sigma signal is calculated at every clock cycle and then used to calculate the next quantizer input. Thus, the speed of the delta sigma modulator is limited by the delay of the feedback path calculation. This delay may depend on the feedback transfer function complexity and the transistor delay. As a result, conventional delta sigma modulators are typically limited to a few hundred MHz. However, there are applications such as switched-mode PAs that utilize delta sigma modulators that operate at rates approaching or exceeding several GHz. Accordingly, many embodiments of the invention implement a feedback structure that can enable operation of a delta sigma modulator at higher rates, as described in detail below.

Very Fast Delta Sigma Modulator Implementation

Many embodiments of the invention increase the speed of the feedback structure of a delta sigma modulator. In accordance with many embodiments of the invention, the speed of the error structure is increased by using parallel error feedback paths. In accordance with a number of embodiments, the use of parallel feedback paths is provided by using zero coefficients in one or more filters in one or more of the parallel feedback paths. In particular, many embodiments of error feedback paths of delta sigma modulators, such as the error feedback path shown in FIG. 3, implement the z-transform of the signal in error feedback path as follows:

$V(z)$ is the delta sigma modulator output;
$U(z)$ is the delta sigma modulator input;
$E(z)$ is the quantization error;

Using the above definitions, the delta sigma modulator can be expressed by the following equation:

$$U(z)-H_e(z)E(z)-V(z)=-E(z)$$

The above equation can be rearranged as follows:

$$V(z)=U(z)+E(z)(1-H_e(z))$$

The signal transfer function, STF(z)=1, defines the input-output signal relationship. The noise transfer function, NTF $(z)=(1-H_e (z))$, defines the output noise and quantization noise relationship. As such, the NTF(z) determines the noise shaping and can be expressed in an infinite impulse filter (IIR) form where N is the order of the filter as follows:

$$NTF(z) = \frac{B(z)}{A(z)} = \frac{1+\beta_1 z^{-1}+\beta_2 z^{-2}+\ldots+\beta_N z^{-N}}{1+\alpha_1 z^{-1}+\alpha_2 z^{-2}\ldots+\alpha_N z^{-N}}$$

The error feedback transfer function $H_e$ (z) can be expressed in terms of NFT(z) as follows:

$$H_e(z) = 1-NTF(z) = \frac{(\alpha_1-\beta_1)z^{-1}+(\alpha_2-\beta_2)z^{-2}+\ldots+(\alpha_N-\beta_N)z^{-N}}{1+\alpha_1 z^{-1}+\alpha_2 z^{-2}\ldots+\alpha_N z^{-N}}$$

Figure 4:
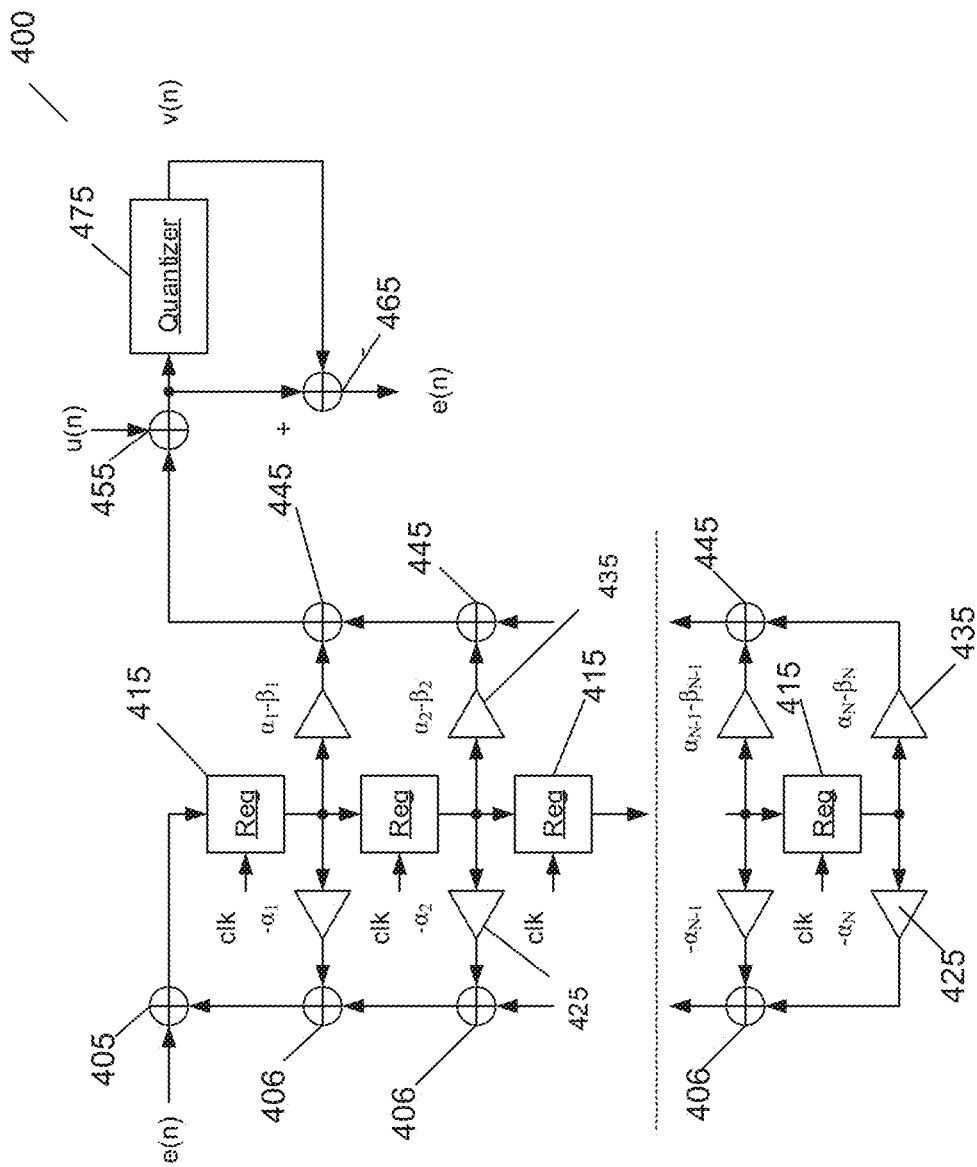
FIG. 4 illustrates an error feedback structure.

An implementation of an error feedback path having an N order filter for a delta sigma modulation system is shown in FIG. 4. One skilled in the art will recognize that only the components of a delta sigma modulator necessary for understanding an N order error feedback path are shown in FIG. 4. Furthermore, the components and/or processes illustrated in FIG. 4 may be implemented by hardware components, software components, or any combination thereof.

An N order filter 400 for a delta sigma modulator is shown in FIG. 4. The N order filter 400 receives an input error signal, e(n), in adder component 405 that adds the input error signal with the response of the N order filter. The corrected input error signal is accumulated in a delay line of N registers 415 that forms the N order filter. Each of the N registers 415 provides the corrected input error signal to a first error filter component 425 and a second error filter component 435. Each of the nth order first error filter components 425 multiplies the corrected error signal in a given register n by a coefficient, $\alpha_n$. The weighted outputs of each of the N registers is then combined by the adder components 406 to form the denominator of feedback transfer function $H_e$ (z). The second error filter components 435 receive the corrected input signal from each of the N registers 415 and multiply the corrected input signal from a given register n by a coefficient, $\alpha_n-\beta_n$. The weighted accumulated corrected input error signals are then combined by the adders 455 to generate the numerator of the feedback transfer function $H_e$ (z). As noted above, all of the computations can be performed in parallel during each clock cycle as the calculation of the filter output simply requires generation of the weighted sum of the accumulated corrected input error signals.

Adder component 455 receives the signal corresponding to the numerator of the transfer function and a delta sigma modulator inputs signal, u(n), via an input and adds the signals to generate an adjusted reference signal. The output signal from adder component 455 is provided to a quantizer 475. Quantizer 475 generates a quantized signal that is provided as a delta sigma modulator output, v(n), via an output. The quantizer output is also provided to the adder component 465. The adder component 465 subtracts the adjusted reference signal and the quantized signal from quantizer 475 to generate an error signal. When each of the N registers is clocked by the system clock of the delta sigma modulator, the corrected input signal stored in a given register is shifted to an adjacent register (e.g. the corrected input signal stored in register n is shifted to register n+1). In the illustrated embodiment, the rate of the delta sigma modulator can be limited by the rate at which the delay line can be clocked.

As can be seen from FIG. 4, all of the registers from the N orders of the error feedback path are clocked at the same speed as the delta sigma modulator. Accordingly, all operations in the feedback path are completed in one clock cycle. The feedback path is the critical path in this design that can limit the maximum speed of the delta sigma modulator.

Parallel Error Feedback Paths in a Delta Sigma Modulator

In light of the fact that the error feedback path limits the maximum speed of a delta sigma modulator, the speed of the error feedback path needs to be improved in order to increase the speed of the modulator. In accordance with some embodiments of the invention, the speed of the error feedback path in a delta sigma modulator is improved by uncoupling the error feedback path from the clock speed of the modulator. In accordance with many embodiments, the uncoupling is achieved by setting one or more filter coefficients to zero. In accordance with a number of embodiments, the setting of one or more filter coefficients to zero allows the use of two or more parallel feedback error paths in a delta sigma modulator that can perform calculations more slowly than the rate of the delta sigma modulator. In accordance with several of the embodiments, the first K coefficients of the filter are set to zero allowing K error feedback paths to compute the error in parallel. This can improve the speed of the error feedback paths by at least K times the clock speed.

Figure 5:
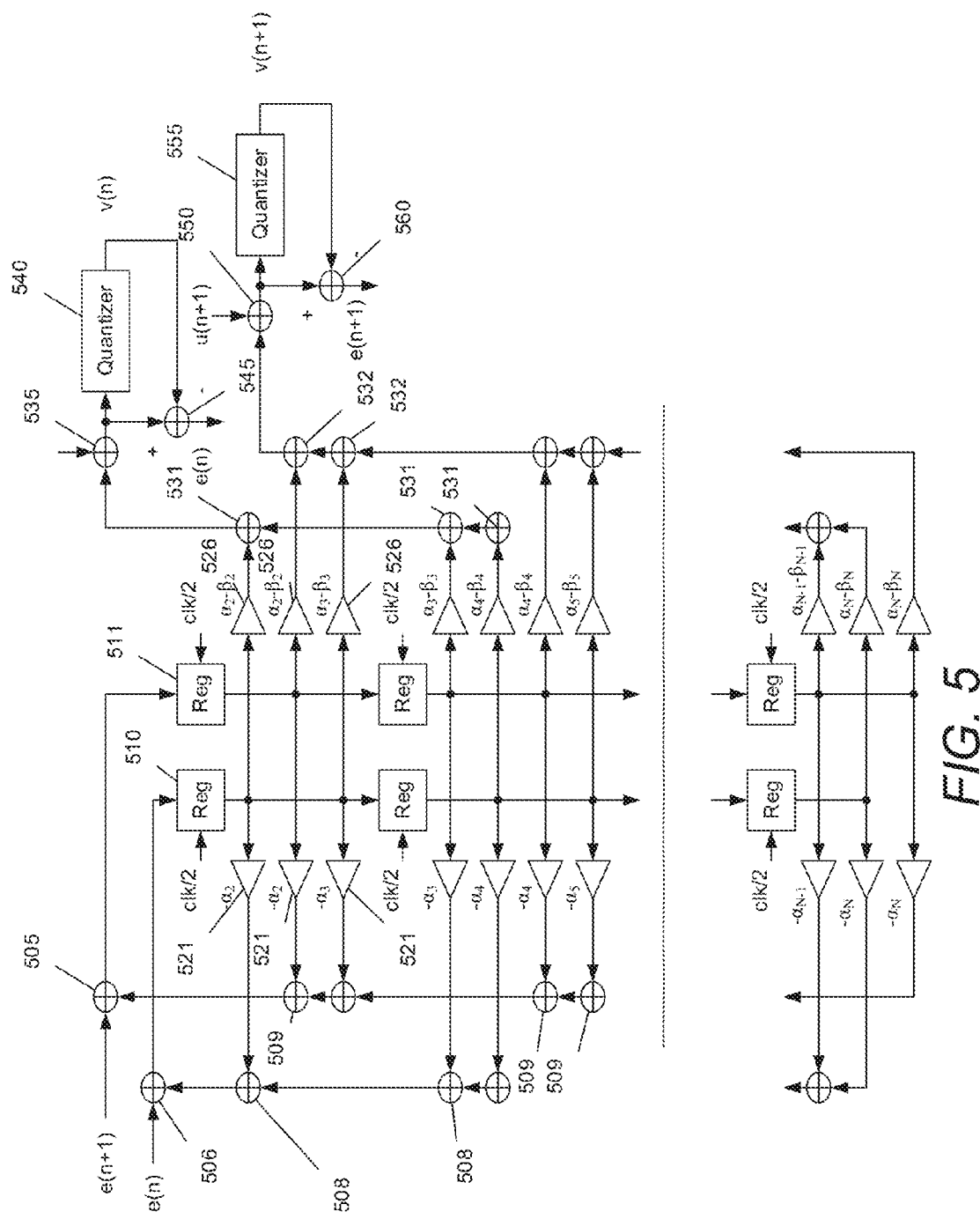
FIG. 5 illustrates an example feedback path in accordance with an embodiment of the invention.

A feedback loop filter in a delta sigma modulator where both $\alpha_1$ and $\beta_1$ are zero for use in an error feedback circuit having parallel error feedback paths in accordance with an embodiment of the invention is illustrated in FIG. 5. The fact that $\alpha_1$ and $\beta_1$ of the filter are zero translates into an implementation in which a feedback path simply does not include circuitry necessary to connected the register containing the most recently stored value to the circuitry used to calculate the error feedback path. The circuitry of the parallel feedback paths is discussed further below.

The feedback loop filter 500 is divided into 2 parallel delay lines 510, 511 running at half (½) of the clock rate, where the registers in each of the delay lines accumulate N/2 corrected input error signals and the values are shifted between registers every two clock cycles. The output of a given register n is scaled by a number of different coefficients 521 and two weighted sums are formed by adder components 509. Each of the weighted sums is combined with the appropriate error signal e(n) and e(n+1) to create the corrected input error signals provided to each of the delay lines respectively.

Similarly, weightings 526 can be applied to the corrected input error signals in each of the delay lines and added using adder components 531, 532 to form the numerator of the feedback transfer function $H_e(z)$ at each clock time interval and the resulting value utilized to generate an error feedback signal that is combined with the delta sigma input (u(n), u(n+1)) and quantized using quantizers 540, 555 to produce the delta sigma modulator output (v(n), v(n+1)). The output selected as the delta sigma modulator output alternates each clock cycle. Each of the two output signals adjusts once per two clock cycles; the adjustments occurring out of step with each other by one clock cycle. Adder components 535, 545, 540, 550 subtract the quantized outputs from the sums of the delta sigma modulator input signals and the error feedback signals to produce the next error signal (e(n), e(n+1)).

The effective speed of a delta sigma modulator utilizing a feedback filter similar to that illustrated in FIG. 5 may double (2×) relative to the speed with which individual calculations can be performed within the feedback loop filter. This approach may be extended to zeroing out the first k−1 coefficients and achieving a k times speed increase by providing k parallel paths that each operate at a 1/k clock rate. Although FIG. 5 illustrates the error feedback of a delta sigma modulator divided into two parallel paths, other implementations in accordance with some other embodiments may utilize more than two parallel paths in order to further reduce the clock delay of the feedback loop and thus increase the speed of the delta sigma modulator.

Figure 6:
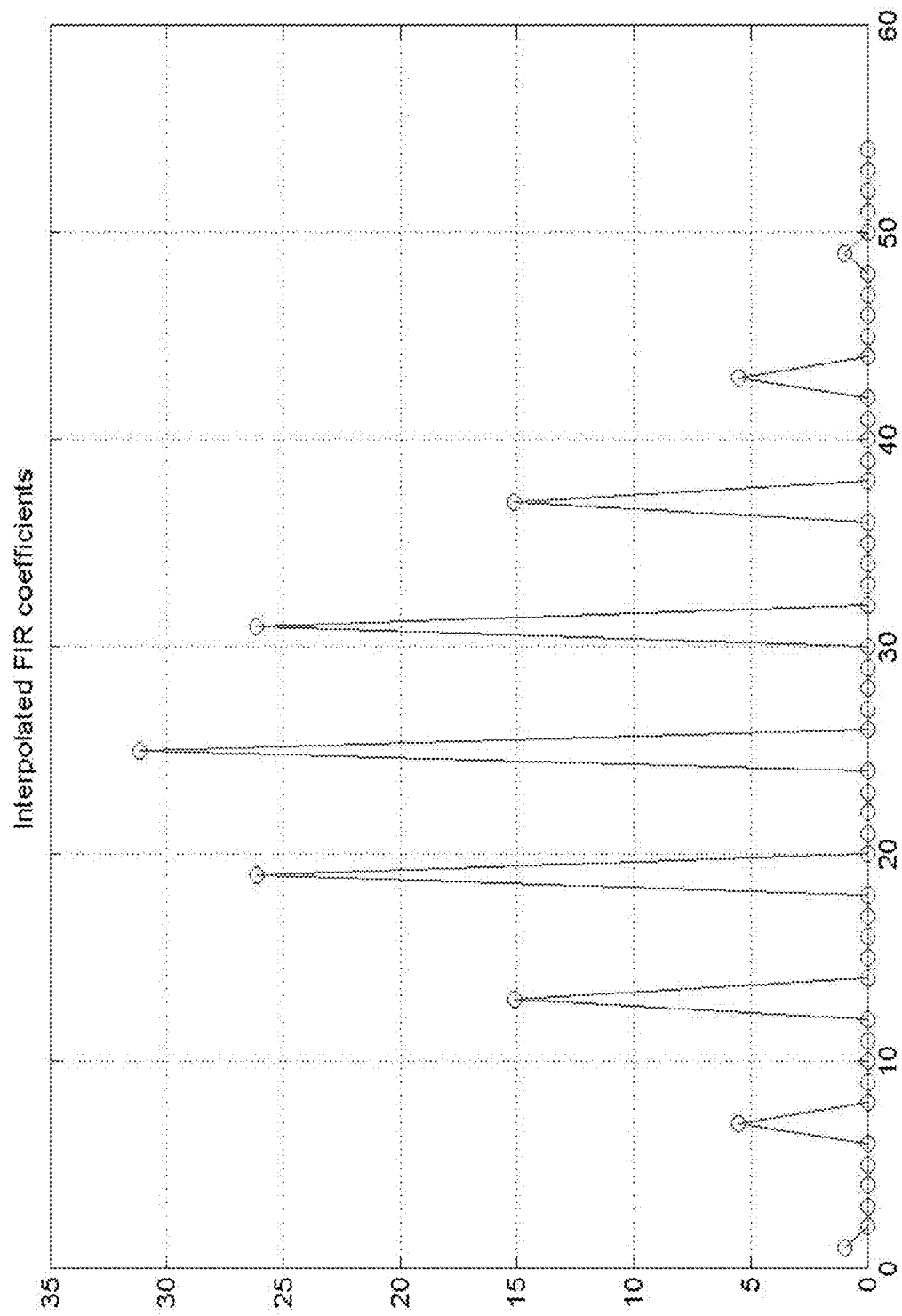
FIG. 6 illustrates the coefficients of an interpolated filter in accordance with an embodiment of the invention.
Figure 7:
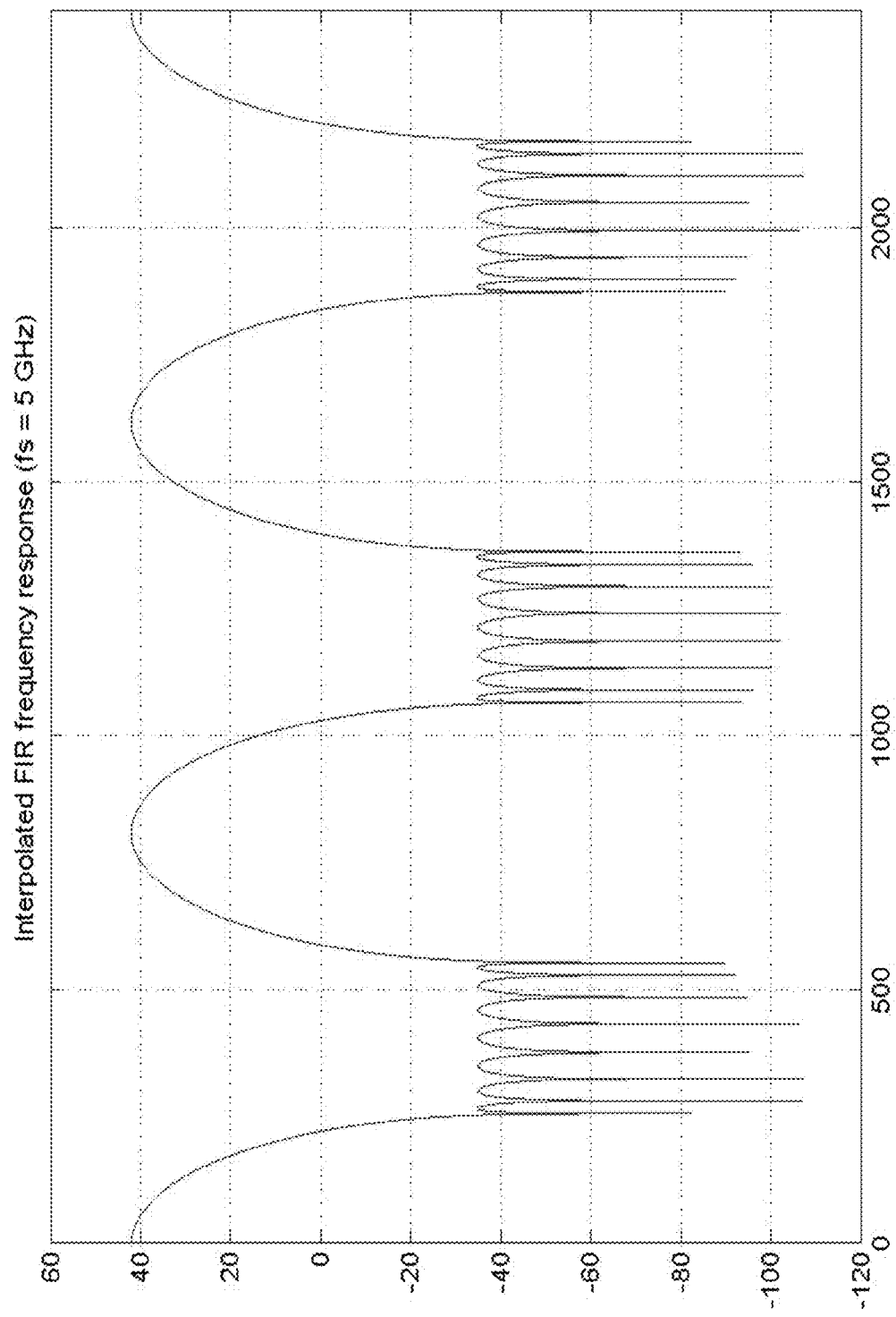
FIG. 7 illustrates the frequency response of an interpolated filter with fs=5 GHz in accordance with an embodiment of the invention.

The architecture utilized by many embodiments of the invention achieves speed improvement by placing constraints on the delta sigma modulator filter coefficients. In particular, many embodiments constrain some filter coefficients to be zero so parallel implementation of the feedback paths that are clocked by clock signals that have lower clock rates that the rate at which the delta sigma modulator output changes its output value is possible. There are many ways to achieve the desired noise shaping response and meeting this filter coefficient constraint at the same time. Some embodiments use an interpolated FIR or IIR filter for the noise shaping transfer function. The interpolated filter may have a special property for its coefficients. The coefficients of an interpolated filter are shown in FIG. 6. As can be seen from FIG. 6, one of the six coefficients is non zero with the remaining coefficient being zero. In such an embodiment, a six times increase of the output speed may be achieved. The frequency response of an interpolated filter with a sampling frequency $F_s$=5 GHz is shown in FIG. 7. In the interpolated filter described by FIG. 7, the actual hardware speed is ⅙ of $F_s$ due to parallelization that is easily achievable using today's technology. Many embodiments can thus achieve k times speed improvement using an interpolated filter with order N in which the first k−1 coefficients are zero by providing k parallel feedback paths operating at 1/k the clock rate of the delta sigma modulator. Certain embodiments design the transfer function using an optimization algorithm (linear programming, quadratic programming, and convex programming) with zero filter coefficients in selected locations.

Although the present invention has been described in certain specific aspects, many additional modifications and variations would be apparent to those skilled in the art. It is therefore to be understood that the present invention may be practiced otherwise than specifically described, including various changes in the implementation. Thus, embodiments of the present invention should be considered in all respects as illustrative and not restrictive.

What is claimed is:

1. A delta sigma modulator comprising:
   a system clock input configured to receive a system clock signal;
   a delta sigma modulator input configured to receive an input signal;
   a delta sigma modulator output configured to provide a delta sigma modulated output;
   a truncator configured to generate the delta sigma modulated output based upon a sum of the input signal and an error feedback signal;
   an error feedback system that generates the error feedback signal, where the error feedback system comprises:
   k feedback paths that execute in parallel;
   wherein each of the k paths are clocked to 1/k clock cycles of the system clock signal and wherein k is an integer equal to or greater than two.

2. The delta sigma modulator of claim 1, wherein the error feedback system receives as an input a difference between:
   the sum of the input signal and an error feedback signal; and
   the delta sigma modulated output.

3. The delta sigma modulator of claim 2 wherein the delta sigma modulator is an N order delta sigma modulator where N is an integer equal to or greater than two.

4. The delta sigma modulator of claim 3 wherein each of the k feedback paths include N/k registers that are clocked at a rate 1/k of the system clock signal.

5. The delta sigma modulator of claim 4 wherein each of the k feedback path generates a signal that is a weighted sum of values stored in the N/k registers, where the generated signal is combined with the input to the error feedback system.

6. The delta sigma modulator of claim 4 wherein each of the k feedback path generates a signal that is a weighted sum of values stored in the N/k registers, where the generated signal is quantized by a quantizer to produce an error feedback signal.

7. The delta sigma modulator of claim 3 wherein k is less than N.

8. The delta sigma modulator of claim 1 wherein the truncator is a quantizer.

9. The delta sigma modulator of claim 1 wherein each of the k feedback paths are out of phase with each other.

10. The delta sigma modulator of claim 9 wherein each feedback path generates a separate output and the delta sigma modulator output is selected from the output of a different feedback path every clock cycle of the system clock signal.

11. A method for providing a filtered error signal for a delta sigma modulator comprising:
   receiving a system clock signal at a system clock input;
   receiving a delta sigma modulator input signal at a delta sigma modulator input;
   summing the input signal and an error feedback signal;
   truncating the sum of the input signal and an error feedback signal to produce a delta sigma modulator output signal;
   outputting the delta sigma modulator output signal on a delta sigma modulator output;
   wherein the error feedback signal is generated by an error feedback system using:
   k feedback paths that execute in parallel;
   wherein each of the k paths are clocked to 1/k clock cycles of the system clock signal and wherein k is an integer equal to or greater than two.

12. The method of claim 11, wherein the error feedback system receives as an input a difference between:
   the sum of the input signal and an error feedback signal; and
   the delta sigma modulated output.

13. The method of claim 12 wherein the delta sigma modulator is an N order delta sigma modulator where N is an integer equal to or greater than two.

14. The delta sigma modulator of claim 13 wherein each of the k feedback paths include N/k registers that are clocked at a rate 1/k of the system clock signal.

15. The method of claim 13 wherein each of the k feedback path generates a signal that is a weighted sum of values stored in the N/k registers, where the generated signal is combined with the input to the error feedback system.

16. The method of claim 13, wherein each of the k feedback path generates a signal that is a weighted sum of values stored in the N/k registers, where the generated signal is quantized by a quantizer to produce an error feedback signal.

17. The method of claim 12 wherein k is less than N.

18. The method of claim 11, wherein the truncator is a quantizer.

19. The method of claim 11 wherein each of the k feedback paths are out of phase with each other.

20. The method of claim 19 wherein each feedback path generates a separate output and the delta sigma modulator output is selected from the output of a different feedback path every clock cycle of the system clock signal.

* * * * *